(12) United States Patent
Lajoie et al.

(10) Patent No.: US 8,793,599 B1
(45) Date of Patent: Jul. 29, 2014

(54) HYBRID PROCESSING INTERFACE

(75) Inventors: Dave Lajoie, San Francisco, CA (US); Hilmar Koch, Oakland, CA (US); Kent Oberheu, Berkeley, CA (US)

(73) Assignee: Lucasfilm Entertainment Company Ltd., San Francisco, CA (US)

( * ) Notice: Subject to any disclaimer, the term of this patent is extended or adjusted under 35 U.S.C. 154(b) by 207 days.

(21) Appl. No.: 13/209,771

(22) Filed: Aug. 15, 2011

(51) Int. Cl.
*G06F 3/00* (2006.01)

(52) U.S. Cl.
USPC ............ 715/762; 715/763; 715/764; 715/765

(58) Field of Classification Search
USPC .................................. 715/762–763, 764–765
See application file for complete search history.

(56) References Cited

U.S. PATENT DOCUMENTS

| | | | |
|---|---|---|---|
| 6,683,619 B1 * | 1/2004 | Samra | 345/619 |
| 7,409,248 B2 * | 8/2008 | Davignon et al. | 700/83 |
| 7,536,645 B2 * | 5/2009 | Ducharme | 715/744 |
| 7,594,180 B1 * | 9/2009 | Langmacher et al. | 715/762 |
| 7,596,757 B2 * | 9/2009 | Kowalski et al. | 715/763 |
| 7,860,691 B2 * | 12/2010 | Beltran et al. | 703/1 |
| 7,945,863 B1 * | 5/2011 | Reid et al. | 715/797 |
| 8,212,806 B2 * | 7/2012 | Maillot et al. | 345/418 |
| 2005/0172242 A1 * | 8/2005 | Vienneau et al. | 715/801 |
| 2009/0183093 A1 * | 7/2009 | Ducharme | 715/763 |
| 2011/0010647 A1 * | 1/2011 | Ducharme | 715/763 |
| 2013/0013264 A1 * | 1/2013 | Narayan et al. | 703/1 |

* cited by examiner

*Primary Examiner* — Kieu Vu
*Assistant Examiner* — Andrew Chung
(74) *Attorney, Agent, or Firm* — Kilpatrick Townsend & Stockton LLP

(57) ABSTRACT

A system includes a computing device that includes a memory configured to store instructions. The computing device also includes a processor configured to execute the instructions to perform a method that includes defining a first portion of a display as a workspace for presenting graphical elements that represent processing operations that define properties of an object. The method also includes defining a second portion of the display, different from the first portion, for presenting a graphical stack that uses the properties from the processing operations to define layers associated with the object. The method also includes simultaneously presenting the first and the second portion on the display.

27 Claims, 8 Drawing Sheets

HYBRID PROCESSING INTERFACE

TECHNICAL FIELD

This document relates to systems and methodologies that use a hybrid interface technique to graphically represent processing operations and define a multi-layered structure, for example, to simulate the physics of layered materials.

BACKGROUND

With ever-increasing computational power and resources, increasingly complex calculations can be efficiently computed in smaller and smaller periods of time. While quickly computable, the underlying processing operations can reach levels of complexities that may become difficult to comprehend at both micro and macro levels. For example, hundreds or thousands of processing operations may be used for simulating objects such as one or more materials and their appearance (e.g., a rusted, slightly dented, blue painted car). However, such large numbers of processing operations and their interactions (e.g., to simulate the appearance of a complex material) may be difficult to track let alone modify (e.g., add a layer of snow onto the rusted, blue painted car).

SUMMARY

The described systems and techniques provide a user interface that implements a hybrid technique to graphically represent processing operations (e.g., for simulating the appearance of a material) and graphically represent layers of an object (e.g., the simulated material). Along with allowing a user to produce such simulations or other types of processing results, the graphical representations allow for efficient review and modifying of the operations and the layers (e.g., adjust a processing operation, add one or more layers to further define the appearance of a simulated material), etc.

In one aspect, a computer-implemented method includes defining a first portion of a display as a workspace for presenting graphical elements that represent processing operations that define properties of an object. The method also includes defining a second portion of the display, different from the first portion, for presenting a graphical stack that uses the properties from the processing operations to define layers associated with the object. The method also includes simultaneously presenting the first and the second portion on the display.

Implementations may also include any or all of the following features. The computer-implemented method of claim 1 may further include adding a layer onto the graphical stack for introducing one or more properties to the object. Adding the layer may include appending the layer to the graphical stack, inserting the layer into the graphical stack or other similar operation. Graphical representations may be used to represent a connection between a layer represented in the graphical stack and a corresponding graphical element that represents a processing operation associated with the connected layer. The connection may be established based upon a naming convention used by an input to the layer represented in the graphical stack and a data source. The connection may be established based upon a priority associated with the processing operation. The graphical elements may include processing nodes of a network. Adjustable parameters may be associated with the processing operations. The graphical elements may be visually compressed. The graphical elements may be expanded from a visually compressed version of the graphical elements. The object is a simulated material or other type or matter.

In another aspect, a system includes a computing device that includes a memory configured to store instructions. The computing device also includes a processor configured to execute the instructions to perform a method that includes defining a first portion of a display as a workspace for presenting graphical elements that represent processing operations that define properties of an object. The method also includes defining a second portion of the display, different from the first portion, for presenting a graphical stack that uses the properties from the processing operations to define layers associated with the object. The method also includes simultaneously presenting the first and the second portion on the display.

Implementations may also include any or all of the following features. The processor may be configured to execute the instructions to add a layer onto the graphical stack for introducing one or more properties to the object. Adding the layer may include appending the layer to the graphical stack, inserting the layer into the graphical stack or other similar operation. Graphical representations may be used to represent a connection between a layer represented in the graphical stack and a corresponding graphical element that represents a processing operation associated with the connected layer. The connection may be established based upon a naming convention used by an input to the layer represented in the graphical stack and a data source. The connection may be established based upon a priority associated with the processing operation. The graphical elements may include processing nodes of a network. Adjustable parameters may be associated with the processing operations. The graphical elements may be visually compressed. The graphical elements may be expanded from a visually compressed version of the graphical elements. The object is a simulated material or other type or matter.

In another aspect, a computer program product tangibly embodied in an information carrier and comprising instructions that when executed by a processor perform a method that includes defining a first portion of a display as a workspace for presenting graphical elements that represent processing operations that define properties of an object. The method also includes defining a second portion of the display, different from the first portion, for presenting a graphical stack that uses the properties from the processing operations to define layers associated with the object. The method also includes simultaneously presenting the first and the second portion on the display.

Implementations may also include any or all of the following features. The computer program product may further including instructions that when executed by the processor perform a method that includes adding a layer onto the graphical stack for introducing one or more properties to the object. Adding the layer may include appending the layer to the graphical stack, inserting the layer into the graphical stack or other similar operation. Graphical representations may be used to represent a connection between a layer represented in the graphical stack and a corresponding graphical element that represents a processing operation associated with the connected layer. The connection may be established based upon a naming convention used by an input to the layer represented in the graphical stack and a data source. The connection may be established based upon a priority associated with the processing operation. The graphical elements may include processing nodes of a network. Adjustable parameters may be associated with the processing operations. The graphical elements may be visually compressed. The graphical elements may be expanded from a visually compressed version of the graphical elements. The object is a simulated material or other type or matter.

Details of one or more implementations are set forth in the accompanying drawings and the description below. Other features, aspects and advantages will be apparent from the description and drawings, and from the claims.

DETAILED DESCRIPTION

Figure 1:
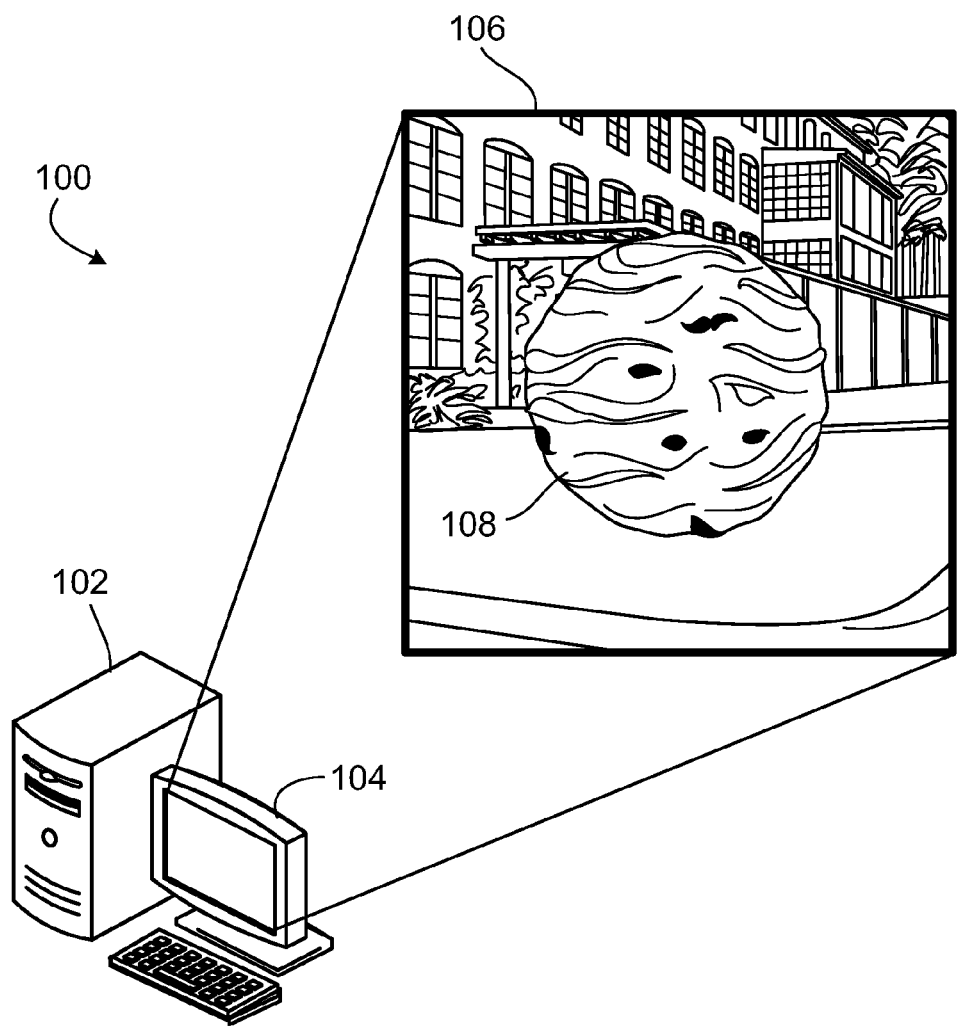
FIG. 1 illustrates an object with a complex material appearance being simulated by a computing device.

FIG. 1 illustrates a computational system 100 for executing complex operations such as simulating the appearances of one or more materials (e.g., a slightly rusted metallic material of an automobile that is painted red). To layout and execute such operations, the computing system 100 implements a hybrid technique in which processing operations, e.g., to define the simulated appearance, are graphically represented (e.g., with one or more networks of processing nodes). Further, layers are graphically represented, e.g., to define layers associated with the appearance of the simulated material. For example, distinct visual portions (e.g., rust, red paint, metallic material, etc.) of the simulated object are graphically represented as layers in a stack (e.g., an aligned graphical representation of a collection of the layers). Along with providing a user with a relatively intuitive representation of the material appearance simulation, the graphical representations of the operations and the material appearance layers allow a user to adjust the processing operations and layers along with modifying associated parameters.

In this particular example, the system 100 includes a computing device (e.g., a computer system 102) that is used for designing complex processing operations (e.g., to simulate the appearance of an object) by allowing a user to graphically represent and edit the operations. Additionally, a stack structure is used to define layers associated with the object (e.g., layers of different materials). As illustrated in the figure, a display 104 (connected to the computer system 102) presents an image 106 that includes a simulated ball 108 that appears to hover in the scene. In this example, the simulated ball 108 is defined by layers of material such as an inner metallic layer that forms the base of the ball. Layers of paint and rust are also included, for example, such that the ball 108 is perceived as being weathered and old. Layers also may also appear to change the geometry of an object, for example, a layer may be applied to the ball 108 to simulate scratches, dimples, pox marks or other types of blemishes. To provide such multi-layered representation of materials, a significant number of operations may need to be designed and executed for each layer. Additionally, one or more of the layers may need to be adjusted such that a desired overall look of the ball 108 is appropriately presented to viewers. Along with representing such a significant number of operations (e.g., hundreds, thousands, etc.) and the layers in an easily comprehensible layout, representing the operations and layers for easy access (e.g., for making adjustments or further development) by a user (e.g., a designer, animator, etc.) may be a challenge with the ever-increasing complexity (e.g., to provide more realistic simulations).

Figure 2:
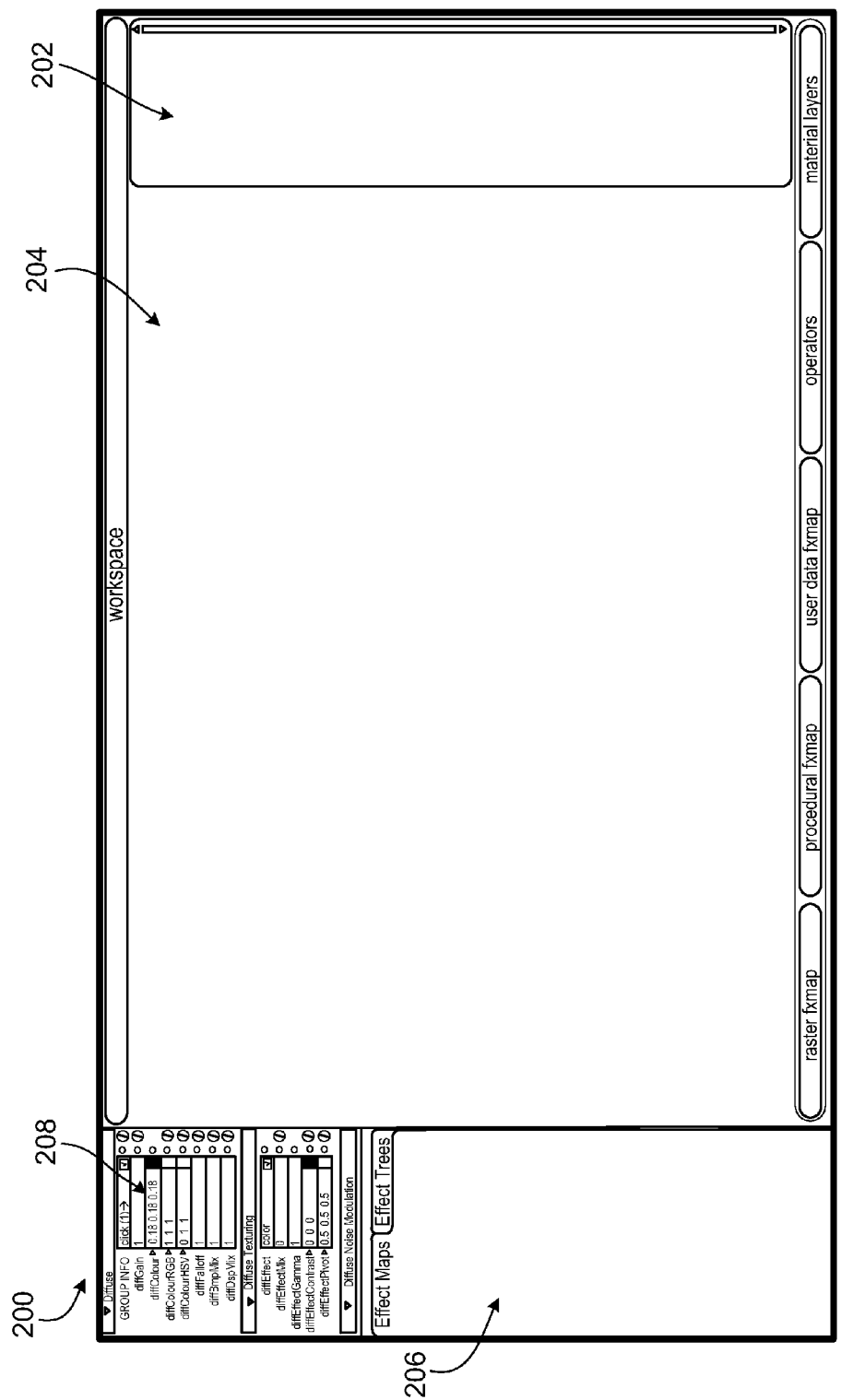
FIG. 2 illustrates a user interface that implements a hybrid technique for defining the appearance of a simulated material.

Referring to FIG. 2, an example graphical user interface (GUI) 200 includes distinct regions for graphically laying out and executing complex processing operations and representing different layers (e.g., material layers). One or more techniques and methodologies may be implemented to provide such layout capabilities. For example, a hybrid technique may be implemented that uses a stack structure to define multiple layers (e.g., material layers) associated with a node-based graph layout that defines operations associated with the layers included in the stack. For example, each layer included in a stack may represent a different layer of a material to be represented (e.g., a paint layer, a rust layer, a scratched surface layer, etc.) and a node-based graph may be used to define operations for producing data associated with the layers (e.g., input data values for paint colors, rust textures, scratch patterns, etc.). By combining these two techniques, a single interface may be provided that can represent a significant amount of processing operations in a graphical layout that can be easily comprehended by a user (and interacted with by the user). Further, by appropriately representing the processing operations in the graphical node-based layout, a user can quickly navigate to regions of interest for easy adjustments without needing to redesign other portions of the layout that may define other unrelated operations. By separately representing layers (e.g., material layers) in such stack structures, a relatively small amount of GUI real estate is needed to provide a significant and potentially complex amount of information. In one illustrative example (as shown in the figure), the GUI 200 includes distinct regions for representing a stack structure and a portion for a node based graph, which represents operations associated with the layers of the stack (e.g., for calculating respective data input values for the layers). In this implementation, a rectangular shaped portion 202 is allocated for representing one or more multi-layer stack structures. For example, an illustrated stack may represent layers of a complex material for representing the appearance of the material. Another portion of the GUI 200 (labeled workspace 204) is relatively larger than the portion 202 of the GUI and is allocated for presenting a workspace that represents one or more editable node based graphs that define operations that are typically associated with material layers represented in the stack (e.g., to calculate input data values associated with material layers such a material properties). In this example, another portion of the GUI 200 provides an area 206 for representing data sources that provide data for the operations executed by the node based graph, for the stack layers, etc. For example, images, numerical data sets and other type of information may be represented in the area 206 of the GUI 200 and used in operations (e.g., represented in the workspace 204) to produce the input data (e.g., property values) for one or more stack layers or directly provided to the stack layers represented in the portion 202.

Additional information may also be represented and presented in the GUI 200. For example, various parameters associated with inputs, outputs, data sources, operations (e.g., effect trees), stack layers etc. may be graphically represented in an adjustable form. Sliding scales, data entry fields, radio buttons and other types of graphical objects may be used to represent and change parameter values and other information related to data sources, processing operations, stack layers, etc. As illustrated in the figure, a portion 208 of the GUI 200 contains a number of fields and other graphical objects for representing such parameters. In general, the area 206 (that represents data sources), the workspace 204 and the portion 202 (for representing a multi-layer stack) are arranged in the GUI 200 such that data generally flows from the viewer's left to right. However, data flows in one or more other directions may also be implemented. In addition to using a single GUI (such as GUI 200), multiple GUIs may be implemented for presenting multiple stacks (e.g., that each contains multiple material layers) and corresponding graphs (e.g., referred to as effect trees in some instances) for executing associated operations. In one arrangement, multiple GUIs may share a common stack. For example, multiple GUIs may be used for providing comprehensible and easily adjustable multi-dimensional stacks (e.g., two-dimensional, three-dimensional stack, etc.) (e.g., with multiple layers) and corresponding node based graphs of associated operations (e.g., effect trees).

Figure 3:
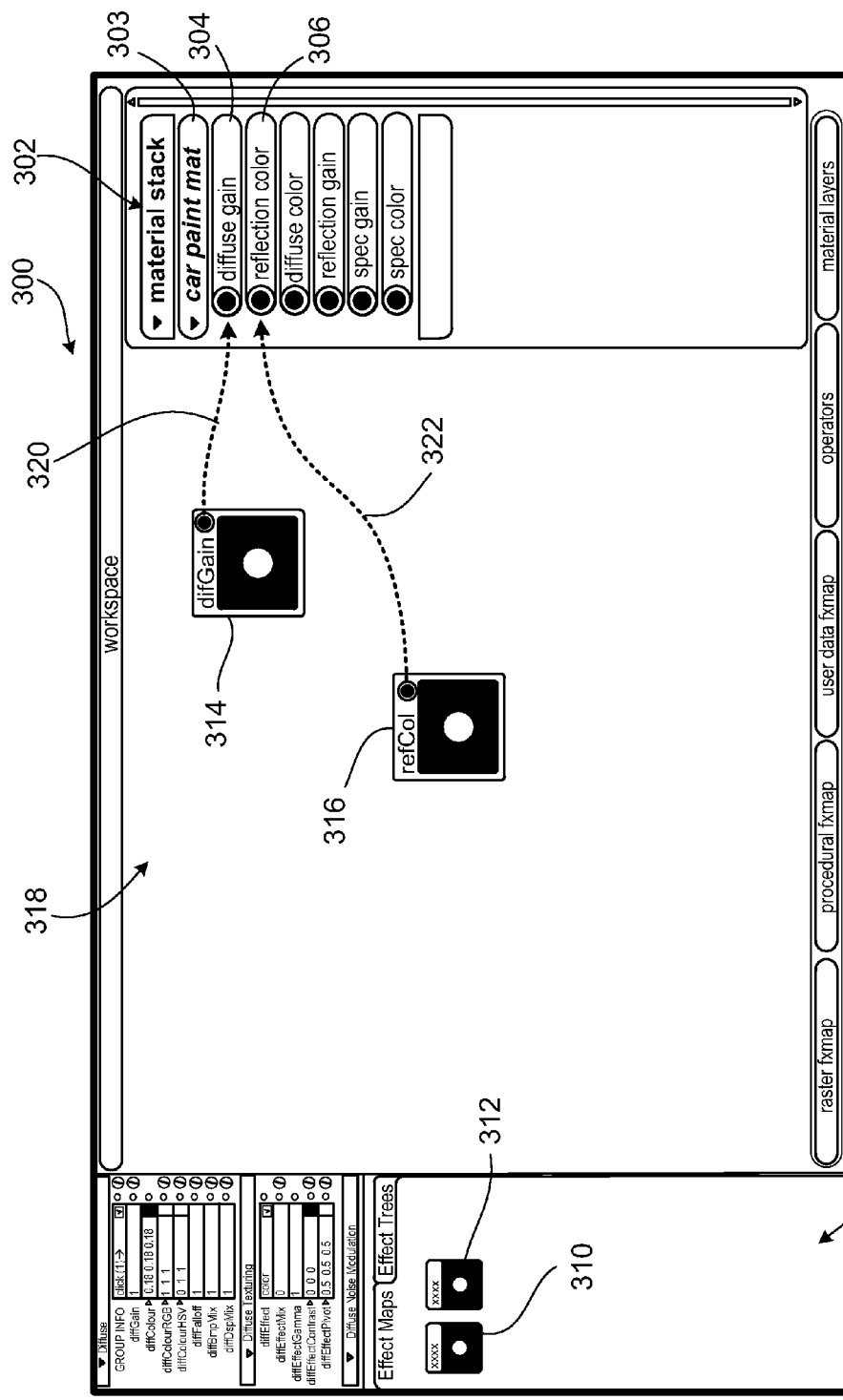
FIGS. 3, 4 and 5 illustrates user interfaces graphically representing processing operations and a multi-layer stack for simulating the appearance of a material.

Referring to FIG. 3, portions of a GUI 300 (similar to the GUI 200 shown in FIG. 2) are populated with graphical elements to represent a relatively simplistic node graph and stack structure. For illustrative purposes, the stack structure is represented by a single-layer stack container 302 in one portion of the GUI (that corresponds to the portion 202 shown in FIG. 2). In this example, the stack container 302 includes a material layer 303 that includes multiple inputs for representing the appearance of a material (e.g., a car paint material). Two of the inputs 304, 306 (identified as diffuse gain and refection color) are associated with two parameters for defining the appearance of the material layer. Such parameters may be represented by one or more quantities, functions, etc. As represented in portion 308 of the GUI, two respective data sources are represented (with graphical icons 310, 312) as having been retrieved, for example, from a data library. To layout processing operations for calculating data values for the inputs 302, 304 included in the stack layer, graphical icons 314, 316 are presented in a workspace 318 (that is similar to the workspace 204 shown in FIG. 2), that correspond to the icons 310, 312 in the GUI portion 308. In this particular example, each of the data sources map directly to the respective inputs of the single material layer 303 (e.g., labeled "car paint mat") included in the stack. Respectively, two dashed lines 320, 322 graphically represent the established direct connections between the icons 314, 316 and corresponding inputs 304, 306 of the single layer of the stack 302. In this example, connectivity between the data sources and inputs is established such that name of a data source (e.g., "difGain" of icons 314, and, "reflCol" of icons 316) is directly connected to an input that has a similar or equivalent name (e.g., "diffuse gain" of input 304, and, "reflection color" of input 306). As such, connections can be automatically established based upon names and naming conventions. Further, by using names to establish connections, sources and/or inputs can be relatively quickly swapped out by adjusting data source and input names rather than laboriously re-wiring connections between icons representing newly introduced data sources and stack inputs, thereby reducing development time and allowing for efficient editing cycles. While the operations illustrated in the workspace 318 of GUI 300 may be considered relatively simplistic, the workspace and the stack (and interactions between the two) can be used for more complex layout and processing schemes (e.g., to simulate the appearance of materials). Further, while this example illustrates six inputs being associated with the single material layer of the stack 302, more or less inputs may be used with the single layer or more layers added to the stack.

Figure 4:
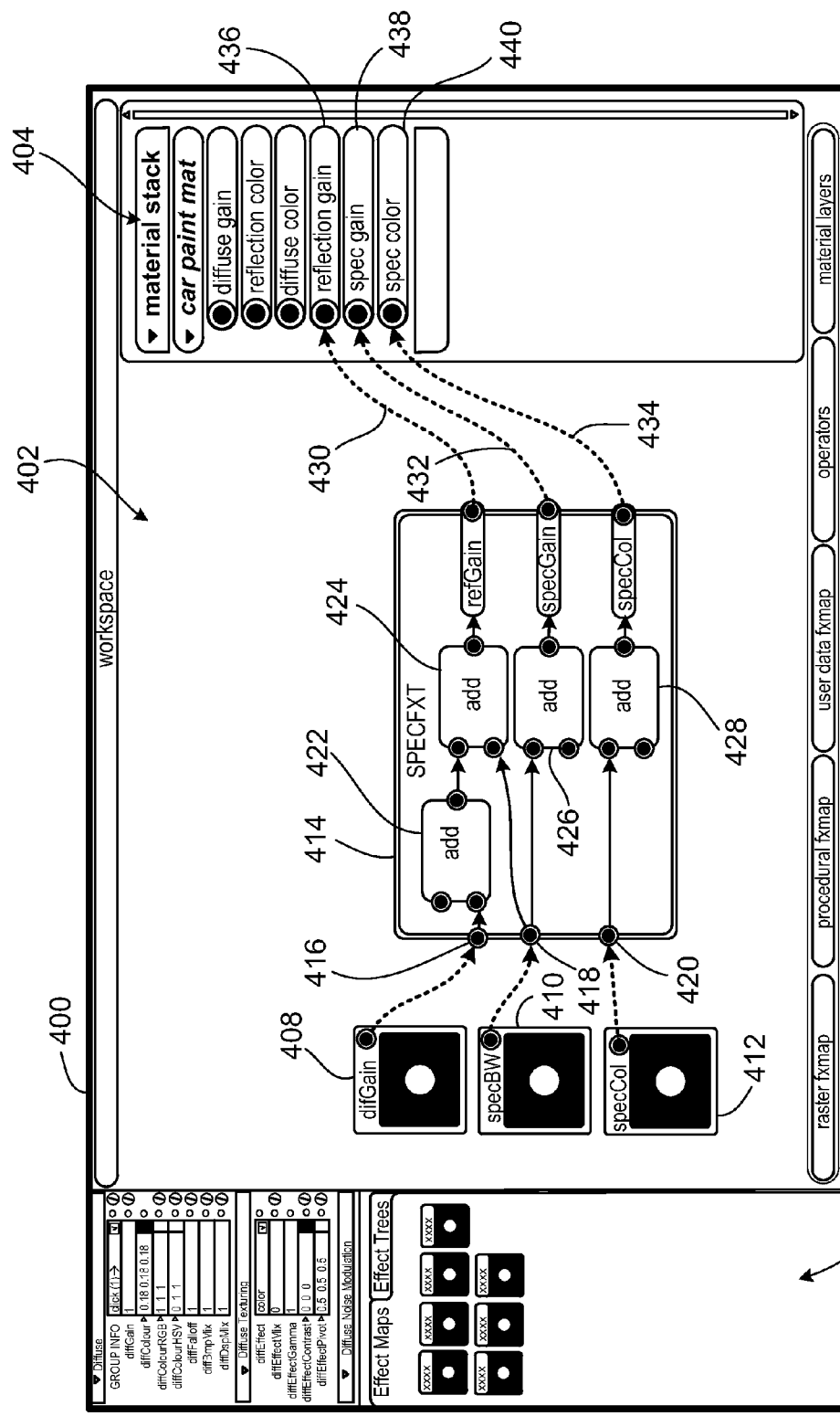

Referring to FIG. 4, a GUI 400 is illustrated that includes portions (e.g., a workspace 402, a single-layer stack structure 404, a portion 406 for presenting data sources, etc.) similar to the GUI 300 (shown in FIG. 3). In this particular example, the workspace 402 illustrates three icons that represent data sources that are also represented in the portion 406 of the GUI and are used for representing the appearance of a material (e.g., car paint). One icon 408 (labeled "reflGain") represents a reflective gain data set while another icon 410 (labeled "specBW") represents specular bandwidth data and a third icon 412 (labeled "specCol") is associated with specular color. In this example, each of the three data sources is used to provide data to corresponding inputs of the single layer represented in the stack 404 (similar to the data provided to the stack 302 shown in FIG. 3). However, rather than establishing a direct link between the icons 408, 410, 412 and the inputs represented in the stack 404 (namely inputs 436, 438, 440), a node based graph 414 is included in the workspace 402 to represent a series of operations for processing the source data (represented by the icons 408, 410, 412) prior to being provided as inputs to the stack. In this particular example, each of the icons 408, 410, 412 are respectively connected to input nodes 416, 418, 420 of the graph 414. In some instances input nodes may be considered as resolved connections, for example, the input node 416 is used for resolving "reflGain" data and establishes a connection with the icon 408 (that corresponds to the "reflGain" data source). Processing of each data set includes a series of additional operations (as represented by graphical elements 422, 424, 426, 428 and referred as effect operators in some instances). In general, connections included in the graph 414 can be considered explicit and not resolved (e.g., a direct connection). Such explicit connections are represented with solid lines, in this example, while dashed lines represent resolved connections. To illustrate the use of a constant value, inputs for some of the graphical elements 422, 426, 428 are represented as being unconnected, while inputs for one graphical element 424 are both connected to input data sets to represent the use of data that may not be invariant. Name resolved connections are illustrated as being established (as represented by dashed lines 430, 432, 434) between corresponding outputs of the graphical elements 424, 426, 428 and inputs 436, 438, 440 (that respectively represent quantities labeled "reflection gain", "spec gain", and "spec color") of the single layer represented in the stack 404. For example, input 436 is used for resolving the "reflGain" data and establishes a connection with a corresponding output (labeled "reflGain") of the graph 414. While a relatively simple operator (e.g., an addition operator) is used in a few instances in this example, various other types of operators may also be used separately or in combination with the presented operators. For example, other mathematical operators (e.g., subtraction, multiplication, division, etc.), statistical operators (e.g., mean, standard deviation, variance, etc.) and other types of processing operators (e.g., logical operators, domain transformations, etc.) may be used for preparing data for the inputs of the layer represented in the stack 404. As can be imagined, as the number of layers increase (e.g., to simulate a large number of material layers), the size of the stack may become visually cumbersome and even distracting for a user. One or more techniques may be used to reduce the visual distractions of an overly complex stack. For example one or more nesting techniques may be implemented for segmenting the stack (to compartmentalize the different layers of a material). Further, by allowing the layers of the stack to expand (and alternatively collapse), the user may be able to adjust the information being presented by the GUI and provide a navigable interface that is less distracting and more efficiently laid out for a user to identify and focus upon a particular portion of graphically represented processing operations and stack layers. Along with manipulating and adjusting the stack to provide easily identifiable and comprehensible layers (e.g., a material layer to be represented), graphical elements represented in the workspace may also be adjustable to provide a more efficient interface for the user. For example, as layers of the stack are expanded and collapsed, presentations of corresponding node-based graphs or graph portions may adjusted for efficient use of the GUI and to provide a more digestible view to a user.

Figure 5:
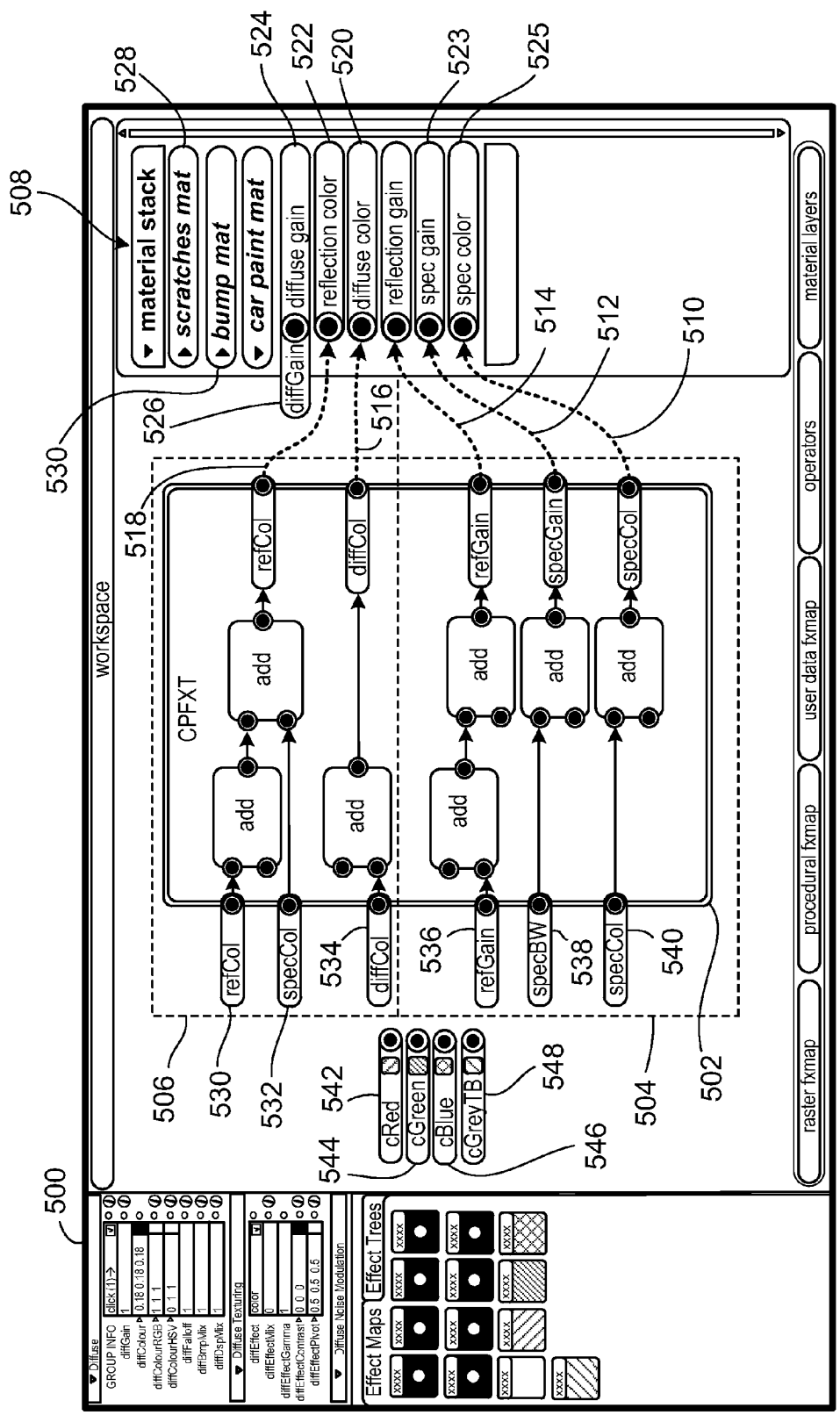

Referring to FIG. 5, another GUI 500 is presented that illustratively demonstrates collapsible and expandable portions of the interface. For example, two or more graphs may be combined to produce a single graph that may reduce the amount of GUI real estate needed while providing functionality that is equivalent to each of the individual graphs. In this example a graph 502 is presented that is combines two separate graphs. As highlighted by a dashed-line box 504, one portion of the graph 502 contains graphical elements of the graph 414 (shown in FIG. 4) and a second dashed-line box 506 contains additional graph elements for operations associated with other inputs to a layer (e.g., car paint layer) of a stack 508 that also includes other material layers (e.g., labeled "scratches mat" and "bump mat"). In this example, the graph highlighted by box 504 provides operations for three inputs (e.g., labeled "reflection gain", "spec gain", and "spec color") to the car paint material layer of the stack 508, as represented by three dashed lines 510, 512, 514. Along with corresponding to the dashed lines 430, 432, 434 shown in FIG. 4, the dashed lines 510, 512, 514 also represent the associated connections are based on resolved names (e.g., output of graph 504 labeled "specGain" is connected to input 523 that is labeled "spec gain", and, the graph output labeled "specCol" is connected to input 525 that is labeled "spec color"). Similarly, as illustrated with dashed lines 516, 518, the newly added upper portion of the graph 502 establishes named resolved connections with two other inputs to the car paint layer included in the stack 508. In this particular example, the newly established name-resolved connections provide data to respective layer inputs 520, 522 labeled "reflection color" (as represented with dashed line 518) and "diffuse color" (represented dashed line 516) from corresponding outputs of the graph 502 labeled "reflCol" and "difCol". Along with establishing additional name-resolved connections to the graph 502, another input 524 (labeled "diffuse gain") for the car paint layer included in the stack establishes a name-resolved connection to a data source 526 names "difGain" by directly docking an icon that represents the data source to the input. As such, name resolved data sources may be directly provided to one or more inputs of layers (e.g., material layers) included in a stack without being processed by operations represented in a graph. Along with establishing additional connections for providing more inputs to a layer included in a stack (e.g., the stack 508), additional layers may be added to a stack. For example, layers may be appended to a stack (e.g., the top of the stack, the bottom of the stack), inserted between current layers, etc. Other types of stack based operations may also be executed (e.g., as directed by a user), for example, a stack layer may be deleted, replaced with another layer, combined with one or more other layers, moved to be nested under another layer, etc. In the illustrated example, two additional material layers have been added to the stack 508 compared to the stack 404 presented in FIG. 4. Along with one material layer 528 associated with defining a scratch layer within the overall material stack, another layer 530 defines a bump layer (e.g., to provide a pox marked appearance to the material defined by the stack). As shown in the figure, both of these added layer 528, 530 are presented as closed representations and do not present any corresponding data inputs for the layers. However, by selecting either (or both) of the material layers (e.g., with a pointing device), the representation may be expanded to expose corresponding input or inputs, e.g., for defining properties associated with the respective material layer (e.g., scratch patterns, average bump height and distribution, etc.). By allowing the various layers and layer inputs to be somewhat hidden, less GUI real estate is used until a user decides to expose the inputs for inspection and other actions (e.g., to establish connections with one or more graphs).

Along with conserving GUI real estate by presenting a stack 508 (and/or portions of a stack) capable of being expanded and compressed (e.g., as directed by a user pointing device), other graphical elements represented in the GUI 500 may also be presented in forms for saving space and reduce visual clutter. For example, sources that provide data to graphs and other elements (e.g., input to layers of the stack 508) presented in the GUI 500 may be represented with a reduced graphical footprint. In this illustration, each of data sources 530-540 connected with docked connections to the graph 502 are shown with reduced size icons. Similarly, the workspace includes four other sources 542-548 that provide data that represent distinct colors (e.g., red, green, blue, no. 18 grey) that provide an invariant color to any portion of a surface to which the color is applied. Being represented by such a reduced size footprints, the sources can be manipulated relatively easily for being placed in various locations of the workspace. For example, the sources 542-548 may be directly connected to the graph 502 for providing data that represents the respective colors for processing by operators included in graph.

Figure 6:
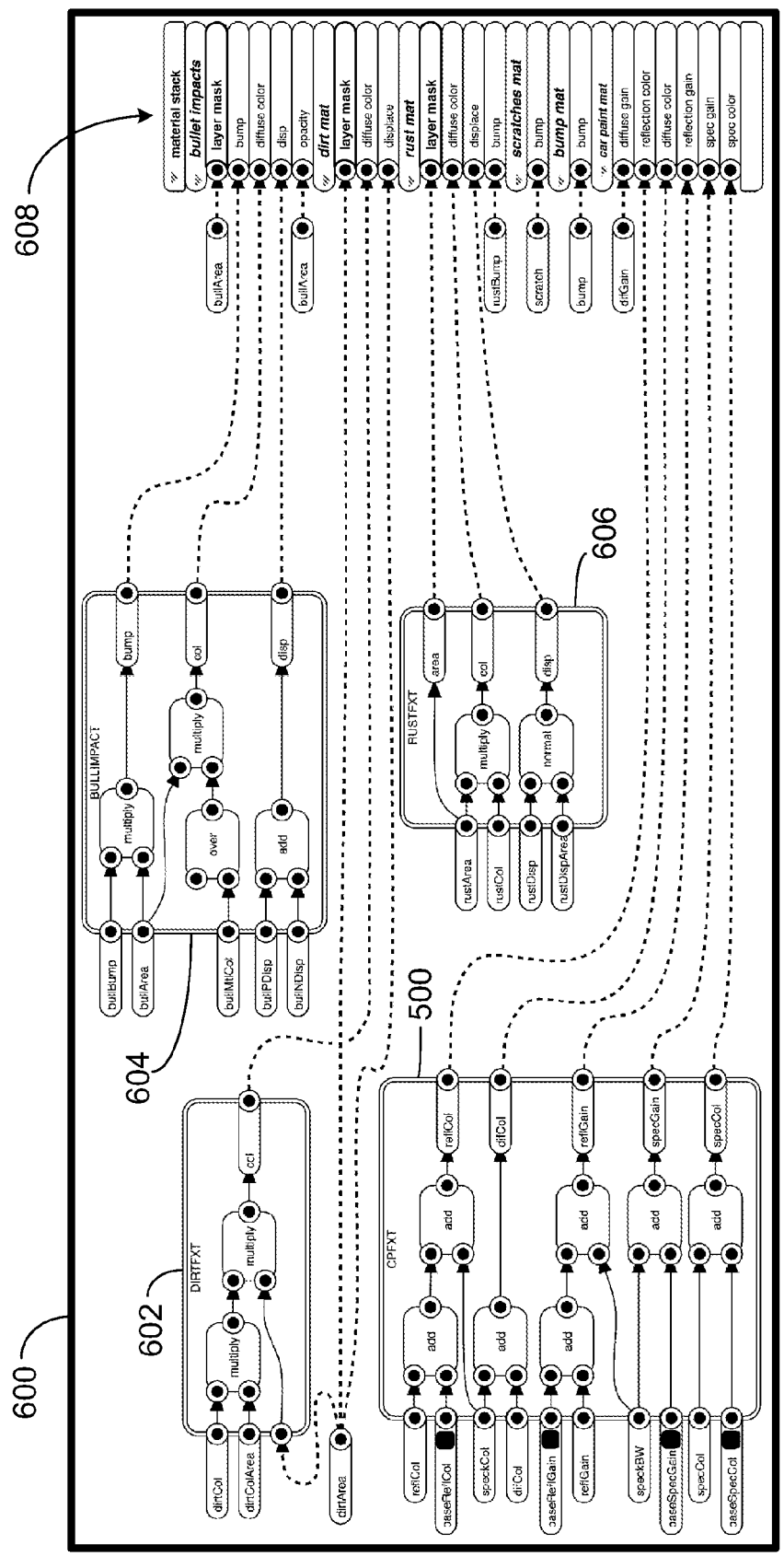
FIG. 6 illustrates a graphical layout operations and layers of a relatively complex simulated material.

Referring to FIG. 6, a graphical layout 600 that includes multiple graph instances (e.g., effect tree) 602, 604, 606 and a multi-layer stack 608 is presented for simulating the appearance of a material. Included with the multiple graph instances 602-606 presented in the layout 600 is the graph 500 shown in FIG. 5. Along with the layers and associated inputs included in the stack 508 shown in FIG. 5 (e.g., a scratched material layer, a bumpy material layer, a car paint layer), the stack 608 also includes some additional layers (e.g., a rust material layer, a dirt material layer and a bullet impact layer) and correspondingly nested inputs (e.g., in which the inputs to a material layer may number in the hundreds). Without considerably disrupting other layers in the stack 602, these newly introduced layers may be efficiently appended, inserted, etc. into the stack. Further, in some arrangements, outputs of an effect tree may be consumed by several effect tree inputs (e.g., of different or the same tree), a number of material layer inputs, combinations of effect tree inputs and material layer inputs, etc. Once residing in the stack 608, connections can be established between the additional layers and the appropriate graph instances (e.g., effect trees) as represented with dashed lines. Various types of conventions may be used to form such connections between graphs and stacks. For example, similar naming conventions between graph outputs and stack inputs may be used to establish connections. By assigning similar names (e.g., names that match) to outputs of a graph and inputs of an associated material layer, an established connection may be used to direct data values calculated by graph to the appropriate material layer input. As such, connections may be established in a relatively automatic manner, and a pointing device (or through another type of user directed technique) is not needed to extend the connection from the graph output to the material layer input. By using such conventions, connections between graphs and stacks can be considered as not being fixed, but considered resolved since modification can be applied at different stages during the creative cycle (e.g., resolved "just-in-time"). As such, graphs may be replaced with other graphs so long as the graph output/material layer input naming convention is followed. For example, one graph (that includes one set of operators) may be replaced with another graph (that includes a different set of operators) without adjusting connections to a stack so long as the output(s) of the new graph follow the naming convention of the output(s) of the graph being replaced. In some arrangements, such replacements may be based upon one or more types of rules. For example, the version of a graph (e.g., effect tree), data source, etc. used to connect to a stack may be based upon a predefined priority. As such, a graph, data source, etc. assigned a higher priority (compared to similar graphs, data sources, etc.) may be identified for insertion and connecting with a stack. As such, similar to being able to efficiently add, delete, and replace layers included in a stack, graphs may also be efficiently added, deleted and replaced without needing to painstakingly re-establish connections between the newly introduced graphs and appropriate layer(s) included in the stack.

Along with storing individual graphs and stacks (e.g., to produce a library) for later retrieval and use, individual material layers and effect trees may also be stored as assets. Further, a combination of a layer and an associated effect tree (that provides calculated output data for the input of the layer) may be stored as an asset. As such, the asset (e.g., combination layer and effect tree) may be appropriately inserted for providing a stack layer and corresponding graph for use in other applications (e.g., to insert another material layer in another material appearance simulation). For example, a dirt material layer may be applied over a metallic material, later; the same dirt material layer may be applied over a wood layer.

The stack 608 provides a significant amount of visual information for digitally representing the appearance of a material while not needing a considerable amount of real estate (of a GUI). Further, combined with the functionality provided by the processing operations of the graphs, the layout 608 is presented in an organized two-dimensional form that may allow for quick inspection by a user, e.g., for efficiently identifying one or more areas in need of attention (e.g., adjustment, further development, etc.). Further, by implementing a stack and graph in concert, each may considerably complement the other while significantly reducing layout need by either individually to digitally represent the appearance of a material.

Figure 7:
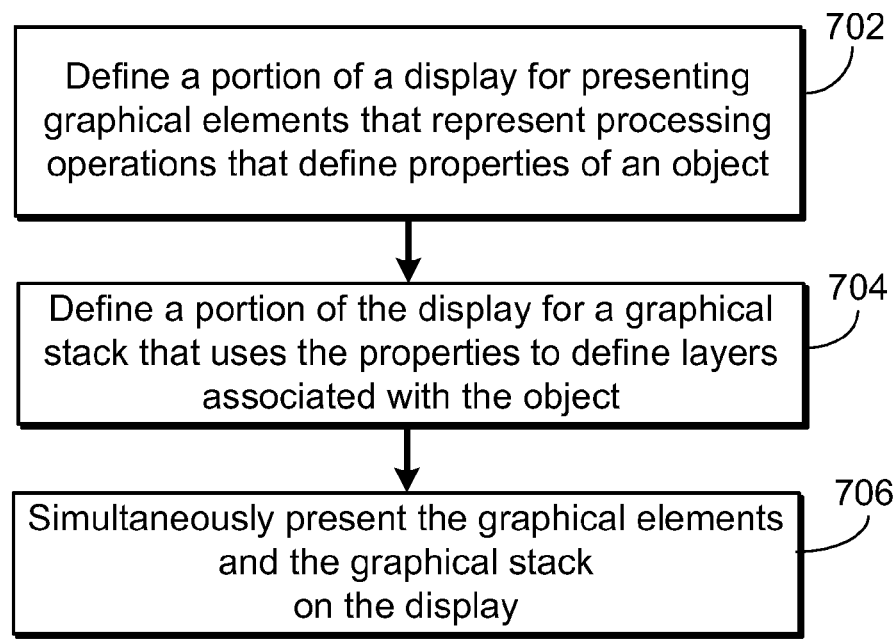
FIG. 7 is an exemplary flowchart of operations for presenting an interface that graphically represents processing operations and a multi-layer stack for defining the appearance of a simulated material.

Referring to FIG. 7, a flowchart 700 represents operations of a computing device such as the computer system 102 (shown in FIG. 1) to produce a graphical user interface that includes a navigable workspace for laying out graphs and associated graphical elements that represent operational components for processing data sources. A multi-layer stack is also represented in the interface for defining layers of an object such as a simulated material that uses the data processed by the graphs. Such operations are typically executed by components (e.g., one or more processors) included in a computing device, however, operations may be executed by multiple computing devices. Along with being executed at a single site (e.g., at the location of the computing device), operations execution may be distributed among two or more locations.

Operations of the computing device may include defining 702 a portion of a display for presenting graphical elements that represent processing operations to define properties of an object. For example, one or more graphs may be presented that represent processing operations for defining properties for simulating the appearance of one or more materials. Operations may also include defining 704 a portion of the display for a graphical stack that uses the properties to define layers (e.g., material layers) associated with the object. For example, the stack may define individual layers and layer sets for defining different portions of the material being simulated. Paint and rust layers may be defined along with layers to provide patterns of scratches and bumps. Some layers may even use properties (e.g., colors, specular patterns, etc.) for defining layers associated with the environment in which the simulated material is located (e.g., define a layer of dirt or snow to be positioned upon the simulated material). Operations may also include simultaneously presenting 706 the graphical elements and the graphical stack on the display. By presenting both, a user interface may provide a single organized view of a potentially complex collection of processing operations and the relationship of layers of an object that are defined by the operations. Along with simulating the appearance of materials, various other types of applications may implement one or more of these techniques. For example, other types of presentations that include significant amounts of detailed information that can be organized into layers may be processed by one or more operational graphs and incorporated into one or more multi-layer stacks.

Figure 8:
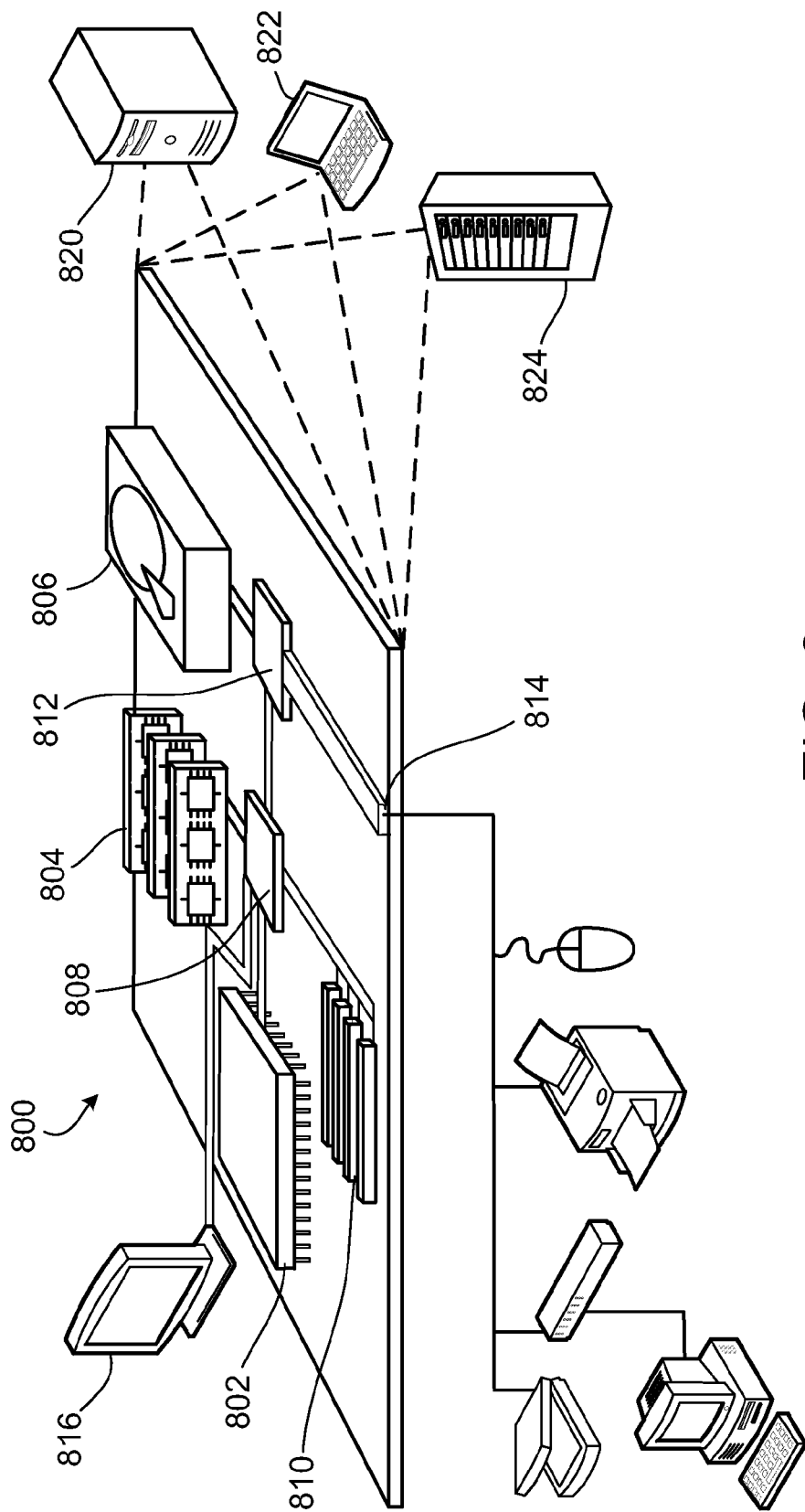
FIG. 8 is a block diagram of computing devices and systems.

FIG. 8 is a block diagram of computing devices that may be used and implemented to perform operations associated with producing and presenting editable user interfaces that include multi-layer stacks and graphs that represent processing operations. As such, the computing devices may provide operations similar to computer systems, servers, etc. Computing device 800 can also represent various forms of digital computers, such as laptops, desktops, workstations, personal digital assistants, servers, blade servers, mainframes, and other appropriate computers.

Computing device 800 includes a processor 802, memory 804, a storage device 806, a high-speed interface 808 connecting to memory 804 and high-speed expansion ports 810, and a low speed interface 812 connecting to low speed bus 814 and storage device 806. Each of the components 802, 804, 806, 808, 810, and 812, are interconnected using various busses, and can be mounted on a common motherboard or in other manners as appropriate. The processor 802 can process instructions for execution within the computing device 800, including instructions stored in the memory 804 or on the storage device 806 to display graphical information for a GUI on an external input/output device, such as display 816 (e.g., a touch screen, a multi-touch screen) coupled to high speed interface 808. In other implementations, multiple processors and/or multiple buses can be used, as appropriate, along with multiple memories and types of memory. Also, multiple computing devices 800 can be connected, with each device providing portions of the necessary operations (e.g., as a server bank, a group of blade servers, or a multi-processor system).

The memory 804 stores information within the computing device 800. In one implementation, the memory 804 is a computer-readable medium. In one implementation, the memory 804 is a volatile memory unit or units. In another implementation, the memory 804 is a non-volatile memory unit or units.

The storage device 806 is capable of providing mass storage for the computing device 800. In one implementation, the storage device 806 is a computer-readable medium. In various different implementations, the storage device 806 can be a floppy disk device, a hard disk device, an optical disk device, or a tape device, a flash memory or other similar solid state memory device, or an array of devices, including devices in a storage area network or other configurations. In one implementation, a computer program product is tangibly embodied in an information carrier. The computer program product contains instructions that, when executed, perform one or more methods, such as those described above. The information carrier is a computer- or machine-readable medium, such as the memory 804, the storage device 806, memory on processor 802, or the like.

The high speed controller 808 manages bandwidth-intensive operations for the computing device 800, while the low speed controller 812 manages lower bandwidth-intensive operations. Such allocation of duties is exemplary only. In one implementation, the high-speed controller 808 is coupled to memory 804, display 816 (e.g., through a graphics processor or accelerator), and to high-speed expansion ports 810, which can accept various expansion cards (not shown). In the implementation, low-speed controller 812 is coupled to storage device 806 and low-speed expansion port 814. The low-speed expansion port, which can include various communication ports (e.g., USB, Bluetooth, Ethernet, wireless Ethernet) can be coupled to one or more input/output devices, such as a keyboard, a pointing device, a scanner, tablet input, spatial input device, or a networking device such as a switch or router, e.g., through a network adapter.

The computing device 800 can be implemented in a number of different forms, as shown in the figure. For example, it can be implemented as a standard server 820, or multiple times in a group of such servers. It can also be implemented as part of a rack server system 824. In addition, it can be implemented in a personal computer such as a laptop computer 822. Alternatively, components from computing device 800 can be combined with other components in a mobile device (not shown). The computing device 800 may also be implemented for network based (e.g., web based) operations such as for cloud computing.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer-readable medium for execution by, or to control the operation of, data processing apparatus. The computer-readable medium can be a machine-readable storage device, a machine-readable storage substrate, a memory device, a composition of matter affecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. For example, the actions recited in the claims can be performed in a different order and still achieve desirable results.

What is claimed is:

1. A computer-implemented method for graphically representing processing operations for layers applied to a simulated material object, the method comprising:
    defining a first portion of a display as a workspace for presenting first graphical elements, wherein:
        the first graphical elements comprise:
            one or more graphical elements representing data sources; and
            one or more graphical elements representing the processing operations that are performed using the one or more data sources as inputs to generate outputs that define layer properties for the layers applied to the simulated material object; and
        the one or more graphical elements representing data sources and the one or more graphical elements representing processing operations are visually represented as a node-based graph that defines a data flow;
    defining a second portion of the display, different from the first portion, for presenting a graphical stack comprising second graphical elements and third graphical elements, wherein:
        each of the second graphical elements represents one of the layers applied to the simulated material object according to an ordering of the second graphical elements in the graphical stack;
        each of the graphical third elements represents parameters for defining an appearance of respective layers, and the graphical third elements are collapsible presented in the graphical stack below graphical second elements representing the respective layers; and
        each of the layers alters an appearance of the simulated material object; and
    simultaneously presenting the first portion of the display and the second portion of the display on a display device, such that the outputs of the node-based graph in the first portion of the display are graphically associated with graphical third elements representing corresponding parameters in the second portion of the display.

2. The computer-implemented method of claim 1, further comprising:
    adding a graphical element onto the graphical stack for introducing a new layer for the simulated material object.

3. The computer-implemented method of claim 2, wherein adding the graphical element includes appending the graphical element to the graphical stack.

4. The computer-implemented method of claim 2, wherein adding the graphical element includes inserting the graphical element into the graphical stack.

5. The computer-implemented method of claim 1, wherein the association is established based upon a naming convention used by an input to the layer represented in the graphical stack and one of the one or more data sources.

6. The computer-implemented method of claim 1, wherein the association is established based upon a priority associated with a processing operation.

7. The computer-implemented method of claim 1, wherein adjustable parameters are associated with the processing operations.

8. The computer-implemented method of claim 1, wherein the node-based graph is visually compressible.

9. The computer-implemented method of claim 8, wherein the node-based graph is expanded from a visually compressed version of the node-based graph.

10. A system comprising:
    a memory configured to store instructions; and
    one or more processors configured to execute the instructions to perform a method comprising:
        defining a first portion of a display as a workspace for presenting first graphical elements, wherein:
            the first graphical elements comprise:
                one or more graphical elements representing data sources; and
                one or more graphical elements representing the processing operations that are performed using the one or more data sources as inputs to generate outputs that define layer properties for the layers applied to the simulated material object; and
            the one or more graphical elements representing data sources and the one or more graphical elements representing processing operations are visually represented as a node-based graph that defines a data flow;
        defining a second portion of the display, different from the first portion, for presenting a graphical stack comprising second graphical elements and third graphical elements, wherein:
            each of the second graphical elements represents one of the layers applied to the simulated material object according to an ordering of the second graphical elements in the graphical stack;
            each of the graphical third elements represents parameters for defining an appearance of respective layers, and the graphical third elements are collapsible presented in the graphical stack below graphical second elements representing the respective layers; and
            each of the layers alters an appearance of the simulated material object; and
        simultaneously presenting the first portion of the display and the second portion of the display on a display device, such that the outputs of the node-based graph in the first portion of the display are graphically associated with graphical third elements representing corresponding parameters in the second portion of the display.

11. The system of claim 10, wherein the processor is configured to execute the instructions to add a graphical element onto the graphical stack for introducing a new layer for the simulated material object.

12. The system of claim 11, wherein adding the graphical element includes appending the graphical element to the graphical stack.

13. The system of claim 11, wherein adding the graphical element includes inserting the graphical element into the graphical stack.

14. The system of claim 10, wherein the association is established based upon a naming convention used by an input to the layer represented in the graphical stack and one of the one or more data sources.

15. The system of claim 10, wherein the association is established based upon a priority associated with a processing operation.

16. The system of claim 10, wherein adjustable parameters are associated with the processing operations.

17. The system of claim 10, wherein the node-based graph is visually compressible.

18. The system of claim 10, wherein the node-based graph is expanded from a visually compressed version of the node-based graph.

19. A computer program product tangibly embodied in a non-transitory computer-readable medium and comprising instructions that when executed by one or more processors cause the one or more processors to perform a method comprising:
    defining a first portion of a display as a workspace for presenting first graphical elements, wherein:
        the first graphical elements comprise:
            one or more graphical elements representing data sources; and
            one or more graphical elements representing the processing operations that are performed using the one or more data sources as inputs to generate outputs that define layer properties for the layers applied to the simulated material object; and
        the one or more graphical elements representing data sources and the one or more graphical elements representing processing operations are visually represented as a node-based graph that defines a data flow;
    defining a second portion of the display, different from the first portion, for presenting a graphical stack comprising second graphical elements and third graphical elements, wherein:
        each of the second graphical elements represents one of the layers applied to the simulated material object according to an ordering of the second graphical elements in the graphical stack;
        each of the graphical third elements represents parameters for defining an appearance of respective layers, and the graphical third elements are collapsible presented in the graphical stack below graphical second elements representing the respective layers; and
        each of the layers alters an appearance of the simulated material object; and
    simultaneously presenting the first portion of the display and the second portion of the display on a display device, such that the outputs of the node-based graph in the first portion of the display are graphically associated with graphical third elements corresponding parameters in the second portion of the display.

20. The computer program product of claim 19, further including instructions that when executed by the processor perform a method comprising:
    adding a graphical element onto the graphical stack for introducing a new layer for the simulated material object.

21. The computer program product of claim 20, wherein adding the graphical element includes appending the graphical element to the graphical stack.

22. The computer program product of claim 20, wherein adding the graphical element includes inserting the graphical element into the graphical stack.

23. The computer program product of claim 19, wherein the association is established based upon a naming convention used by an input to the layer represented in the graphical stack and one of the one or more data sources.

24. The computer program product of claim 19, wherein the association is established based upon a priority associated with a processing operation.

25. The computer program product of claim 19, wherein adjustable parameters are associated with the processing operations.

26. The computer program product of claim 19, wherein the node-based graph is visually compressible.

27. The computer program product of claim 19, wherein the node-based graph is expanded from a visually compressed version of the node-based graph.

* * * * *

UNITED STATES PATENT AND TRADEMARK OFFICE
CERTIFICATE OF CORRECTION

| | | |
|---|---|---|
| PATENT NO. | : 8,793,599 B1 | Page 1 of 1 |
| APPLICATION NO. | : 13/209771 | |
| DATED | : July 29, 2014 | |
| INVENTOR(S) | : Dave Lajoie et al. | |

It is certified that error appears in the above-identified patent and that said Letters Patent is hereby corrected as shown below:

At Column 13, Claim 1, line 59
    Please delete "collapsible" and insert --collapsibly--.

At Column 14, Claim 9, line 27 and 28
    Please delete "node-based" and insert --nodular--.

At Column 15, Claim 18, line 28 and 29
    Please delete "node-based" and insert --nodular--.

At Column 16, Claim 19, line 11
    Please delete "collapsible" and insert --collapsibly--.

At Column 16, Claim 19, line 19
    Please insert --representing-- between "elements" and "corresponding", so that the line reads "graphical third elements representing corresponding parameters in".

At Column 16, Claim 27, line 46
    Please delete "node-based" and insert --nodular--.

Signed and Sealed this
Eighteenth Day of November, 2014

Michelle K. Lee
*Deputy Director of the United States Patent and Trademark Office*